US012813226B2

(12) United States Patent
Sankar et al.

(10) Patent No.: US 12,813,226 B2
(45) Date of Patent: Nov. 24, 2026

(54) METHOD AND APPARATUS FOR DYNAMIC SEALING BETWEEN ZONES OF ULTRA-CLEAN VACUUM SYSTEM

(71) Applicant: KLA Corporation, Milpitas, CA (US)

(72) Inventors: Santosh Kumar Sankar, San Jose, CA (US); Shreyas Bhaban, Milpitas, CA (US)

(73) Assignee: KLA Corporation, Milpitas, CA (US)

(*) Notice: Subject to any disclaimer, the term of this patent is extended or adjusted under 35 U.S.C. 154(b) by 866 days.

(21) Appl. No.: 18/049,863

(22) Filed: Oct. 26, 2022

(65) Prior Publication Data

US 2024/0145290 A1 May 2, 2024

(51) Int. Cl.
*H10P 72/78* (2026.01)
*H10P 72/00* (2026.01)

(52) U.S. Cl.
CPC .......... *H10P 72/78* (2026.01); *H10P 72/0604* (2026.01)

(58) Field of Classification Search
CPC ......... H01L 21/67126; H01L 21/67748; H01L 21/67751; H01L 21/68714; H01L 21/68785; F24F 9/00
See application file for complete search history.

(56) References Cited

U.S. PATENT DOCUMENTS 6,146,267 A * 11/2000 Beudon ..................... F24F 9/00 454/190
7,138,640 B1 11/2006 Delgado et al.
7,428,850 B2 * 9/2008 Naftali .............. H01L 21/67748 73/865.8
2003/0185715 A1 10/2003 Krivts et al.
2005/0042807 A1 2/2005 Pharand et al.
2006/0060259 A1 3/2006 Devitt
2007/0022831 A1 * 2/2007 Naftali ...................... G03F 1/84 250/442.11

(Continued)

FOREIGN PATENT DOCUMENTS

CN 109326537 A 2/2019
JP 2020-527295 A 9/2020

OTHER PUBLICATIONS

WIPO, International Search Report Issued for International Application No. PCT/US2023/035257, Feb. 7, 2024.

(Continued)

*Primary Examiner* — Kaitlin S Joerger
(74) *Attorney, Agent, or Firm* — Hodgson Russ LLP

(57) ABSTRACT

An apparatus includes a vacuum chamber, a first component, a second component that is movable relative to the first component, and a gas injector. The vacuum chamber includes a first vacuum zone and a second vacuum zone. The first component is disposed in the first vacuum zone at an interface with the second vacuum zone. The second component is disposed in the second vacuum zone at the interface and separated from the first component by a gap. The gas injector is configured to inject a buffer gas in the gap between the first component and the second component from at least one hole in at least one of the first component and the second component. The buffer gas provides a dynamic seal between the first vacuum zone and the second vacuum zone during movement of the second component relative to the first component.

20 Claims, 6 Drawing Sheets

(56) References Cited

U.S. PATENT DOCUMENTS

| | | | | |
|---|---|---|---|---|
| 2007/0075501 | A1* | 4/2007 | Hughes | F16J 15/3404 277/411 |
| 2016/0163570 | A1* | 6/2016 | Rice | H01L 21/67751 414/217 |
| 2016/0268097 | A1 | 9/2016 | Rice et al. | |

OTHER PUBLICATIONS

European Patent Office, Supplemental Search Report issued in European Application No. 23883320, dated Jun. 19, 2026, 2 pages.

* cited by examiner

METHOD AND APPARATUS FOR DYNAMIC SEALING BETWEEN ZONES OF ULTRA-CLEAN VACUUM SYSTEM

FIELD OF THE DISCLOSURE

This disclosure relates to sealing devices for semiconductor inspection or metrology systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Some inspection processes need to be performed in a vacuum chamber to prevent outside contaminants from entering the system. Certain components within the vacuum chamber may need to be actuated for alignment reasons, which can use precise (e.g., sub-nanometer) accurate movement for one or more degree of freedom. The actuators required to move these components can outgas volatile hydrocarbons, inorganic contaminations, and particles (collectively referred to as "contaminants" herein). This actuation can generate contaminants that could land on critical surfaces within the system. If contaminants accumulate on these surfaces, it may lead to performance degradation and require invasive preventative maintenance that causes machine downtime. The vacuum chamber can be separated into different vacuum zones to prevent contaminants from reaching these surfaces.

While sealing between different vacuum zones can be achieved between static components using typical elastomeric or metal knife-edge seals, such seals are not effective when the components must move relative to one another. Existing techniques rely on narrow gaps (or labyrinth type seals) between the two movable components to help limit cross-contamination between zones. However, such seals only reduce the amount of material that can move between the zones, and do not result in a complete dynamic seal between the two components.

Therefore, what is needed is dynamic sealing between two movable components in separate zones of a vacuum chamber.

BRIEF SUMMARY OF THE DISCLOSURE

An embodiment of the present disclosure provides an apparatus comprising a vacuum chamber, a first component, a second component, and a gas injector. The vacuum chamber may comprise a first vacuum zone and a second vacuum zone. The first component may be disposed in the first vacuum zone at an interface with the second vacuum zone. The second component may be disposed in the second vacuum zone at the interface and separated from the first component by a gap. The second component may be movable relative to the first component. The gas injector may be configured to inject a buffer gas in the gap between the first component and the second component from at least one hole in at least one of the first component and the second component. The buffer gas may provide a dynamic seal between the first vacuum zone and the second vacuum zone during movement of the second component relative to the first component.

According to an embodiment of the present disclosure, the first vacuum zone and the second vacuum zone may be pumped by separate vacuum pumps. At least one of the first vacuum zone and the second vacuum zone may be at an ultra-high vacuum pressure.

According to an embodiment of the present disclosure, the at least one hole may comprise a plurality of holes. The plurality of holes may be configured to direct the buffer gas towards the first vacuum zone and the second vacuum zone.

According to an embodiment of the present disclosure, the apparatus may further comprise a seal. The seal may be disposed on the first component in the gap. A thickness of the seal may be less than a distance of the gap.

According to an embodiment of the present disclosure, the second component may be movable parallel to the first component along the interface.

According to an embodiment of the present disclosure, the first component may comprise an aperture, and the second component covers the aperture.

According to an embodiment of the present disclosure, the apparatus may further comprise an inspection tool. The inspection tool may be configured to inspect a sample disposed on the second component.

According to an embodiment of the present disclosure, the first component may be a shielding plate and the second component may be a stage.

Another embodiment of the present disclosure provides a method comprising pumping a first vacuum zone and pumping a second vacuum zone. A first component may be disposed in the first vacuum zone, and a second component may be disposed in the second vacuum zone at an interface between the first vacuum zone and the second vacuum zone and separated from the first component by a gap. The method may further comprise injecting a buffer gas in the gap between the first component and the second component from at least one hole in at least one of the first component and the second component. The buffer gas may provide a dynamic seal between the first component and the second component. The method may further comprise moving the second component relative to the first component while maintaining the dynamic seal.

According to an embodiment of the present disclosure, the at least one hole may comprise a plurality of holes, and injecting the buffer gas in the gap between the first component and the second component from at least one hole in at least one of the first component and the second component may comprise injecting the buffer gas in the gap from the plurality of holes in at least one of the first component and the second component. The buffer gas may be directed towards the first vacuum zone and the second vacuum zone by the plurality of holes.

According to an embodiment of the present disclosure, moving the second component relative to the first component may comprise moving the second component parallel to the first component along the interface.

According to an embodiment of the present disclosure, the method may further comprise inspecting, using an inspection tool, a sample disposed on the second component.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Figure 1:
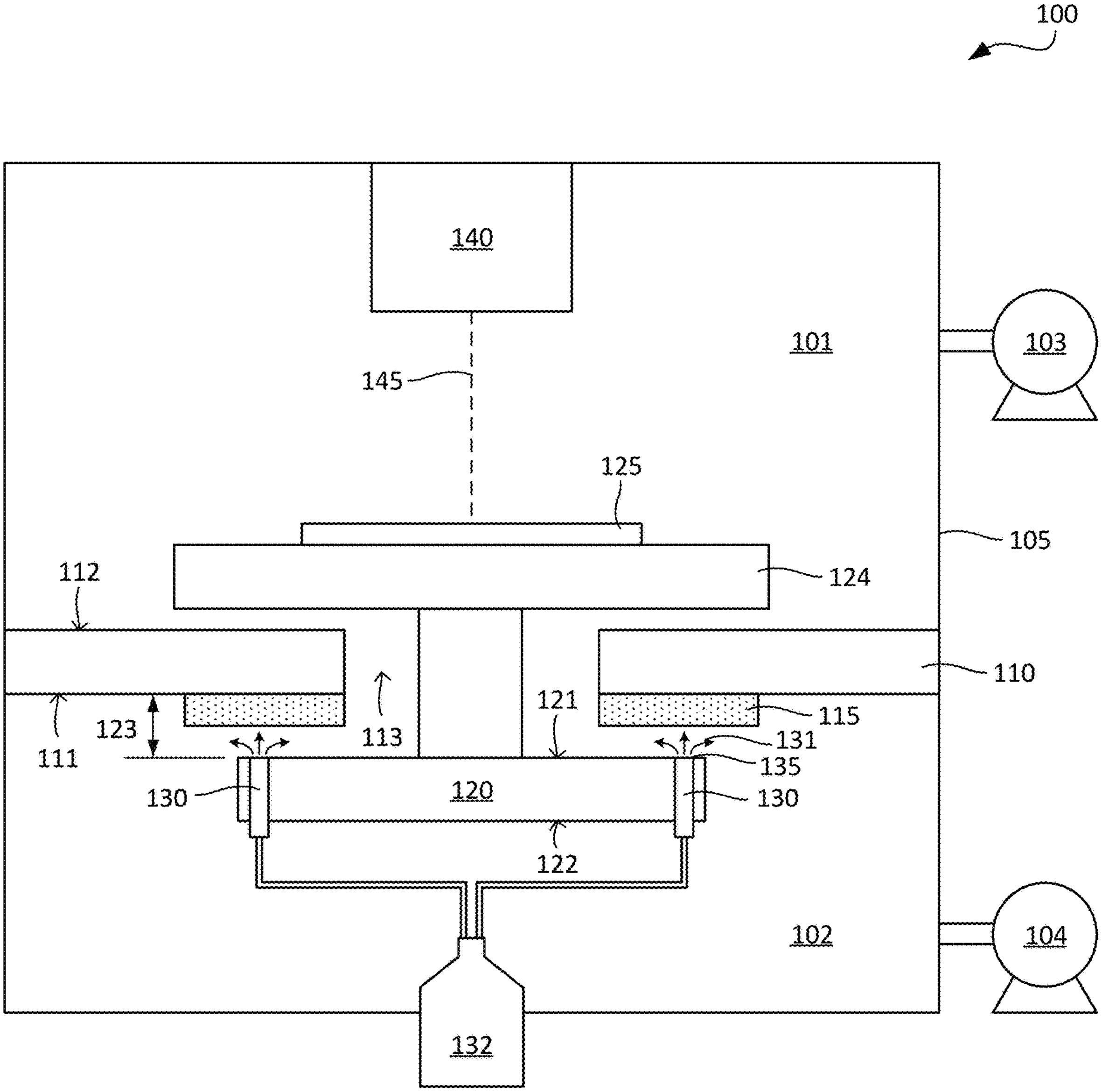
FIG. 1 illustrates an apparatus according to an embodiment of the present disclosure.

An embodiment of the present disclosure provides an apparatus 100 illustrated in FIG. 1. The apparatus 100 may comprise a vacuum chamber 105. The vacuum chamber 105 may comprise a first vacuum zone 101 and a second vacuum zone 102. The first vacuum zone 101 and the second vacuum zone 102 may be pumped by separate vacuum pumps. For example, the first vacuum zone 101 may be pumped by a first vacuum pump 103, and the second vacuum zone 102 may be pumped by a second vacuum pump 104. The first vacuum pump 103 and the second vacuum pump 104 may control the vacuum chamber 105 to low or vacuum pressures in the first vacuum zone 101 and the second vacuum zone 102. The vacuum pressure may be less than $10^{-7}$ mbar. For example, the vacuum pressure may be ultra-high vacuum (UHV) levels (e.g., between $10^{-7}$ and $10^{-12}$ mbar). The first vacuum zone 101 and the second vacuum zone 102 may be kept at the same or different pressures.

Figure 2:
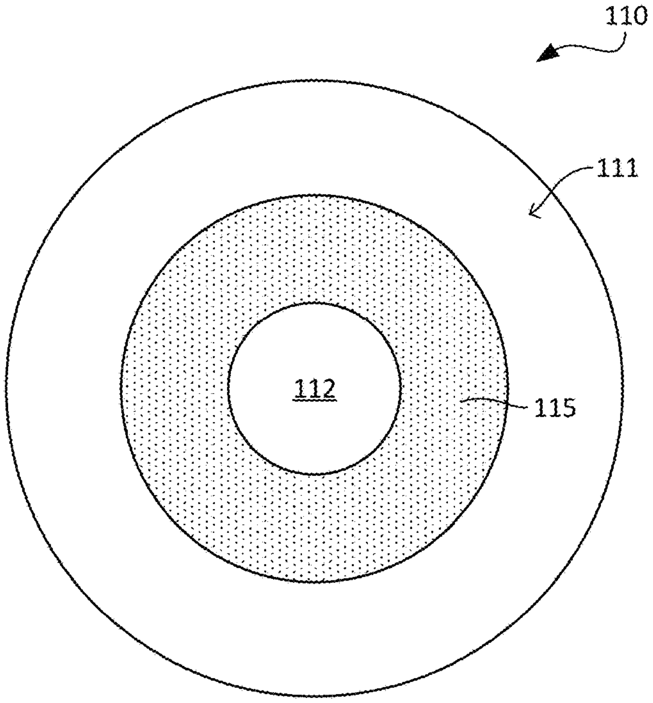
FIG. 2 is a bottom view of a first component according to an embodiment of the present disclosure.

The apparatus 100 may further comprise a first component 110. The first component 110 may be disposed in the first vacuum zone 101 at an interface with the second vacuum zone 102. The first component 110 may have a first side 111 facing the interface with the second vacuum zone 102, and a second side 112 opposite to the first side 111. The first component 110 may have an aperture 113 extending from the first side 111 to the second side 112. The aperture 113 may be centrally disposed in the first component 110. As shown in FIG. 2, the aperture 113 may have a circular or polygonal shape.

The apparatus 100 may further comprise a second component 120. The second component 120 may be disposed in the second vacuum zone 102 at the interface with the first vacuum zone 101. The second component 120 may have a first side 121 facing the interface with the first vacuum zone 101, and a second side 122 opposite to the first side 121. The second component 120 may be separated from the first component 110 by a gap 123. The size of the gap 123 may depend on the dimensions of the components of the apparatus 100 (e.g., the vacuum chamber 105, the first component 110, the second component 120, etc.), or on a gas pressure implemented into the gap 123 (i.e., a stronger gas pressure may require a larger gap to prevent undue impact on moving elements due to the gas pressure). In some embodiments, the gap 123 may be as small as a few nanometers or in the hundreds of microns. For example, the gap 123 may be about 100 μm. The second component 120 may cover the aperture 113 of the first component 110. The second component 120 may be movable relative to the first component 110. For example, the second component 120 may be movable parallel to the first component 110 in at least one direction. The second component 120 may be movable parallel to the first component 110 in two orthogonal directions. The second component 120 may be moved by an x-y actuation system (not shown). When the second component 120 moves relative to the first component 110, the first component 110 and the second component 120 may remain separated by the gap 123.

According to an embodiment of the present disclosure, the first component 110 may be a shielding plate or vacuum chamber wall separating the first vacuum zone 101 and the second vacuum zone. The second component 120 may be a stage movable within the vacuum chamber 105. For example, the second component 120 may comprise a platform 124. The platform 124 may extend through the aperture 113 of the first component 110, into the first vacuum zone 101. The platform 124 may be configured to receive a sample 125. Thus, the sample 125 may be disposed in the first vacuum zone 101, while the actuating components configured to move the second component 120 may be disposed in the second vacuum zone 102. The sample 125 may be a target or work piece, such as a semiconductor wafer or a reticle. In this configuration, the aperture 113 in the first component 110 may allow the second component 120 to move within a certain range of motion. Due to the minimal thickness of the gap 123, a limited amount of contaminants may travel between the first vacuum zone 101 and the second vacuum zone 102 via the gap 123 and the aperture 113. While the apparatus 100 is described with respect to a shielding plate and a stage, it should be understood that the first component 110 and the second component 120 may be other components that move relative to one another in a vacuum chamber.

The apparatus 100 may further comprise a gas injector 130. The gas injector 130 may be configured to inject a buffer gas 131 in the gap 123 between the first component 110 and the second component 120. The buffer gas 131 may be provided by a buffer gas source 132. The buffer gas 131 may be clean dry air (CDA), nitrogen gas, or an inert gas (e.g., argon). The buffer gas source 132 may be configured to control the flow rate of the buffer gas 131. When the buffer gas 131 is injected into the gap 123, the buffer gas 131 may travel to the first vacuum zone 101 and/or the second vacuum zone 102. Thus, the buffer gas 131 may be removed from the vacuum chamber 105 by the first vacuum pump 103 and/or the second vacuum pump 104. The buffer gas source 132 may be configured to control the flow rate of the buffer gas 131 so as to minimize the pumping requirements of the first vacuum pump 103 and the second vacuum pump 104.

Figure 3:
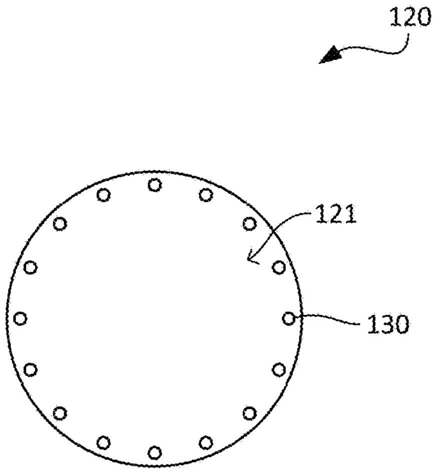
FIG. 3 is a top view of a second component according to an embodiment of the present disclosure.
Figure 5A:
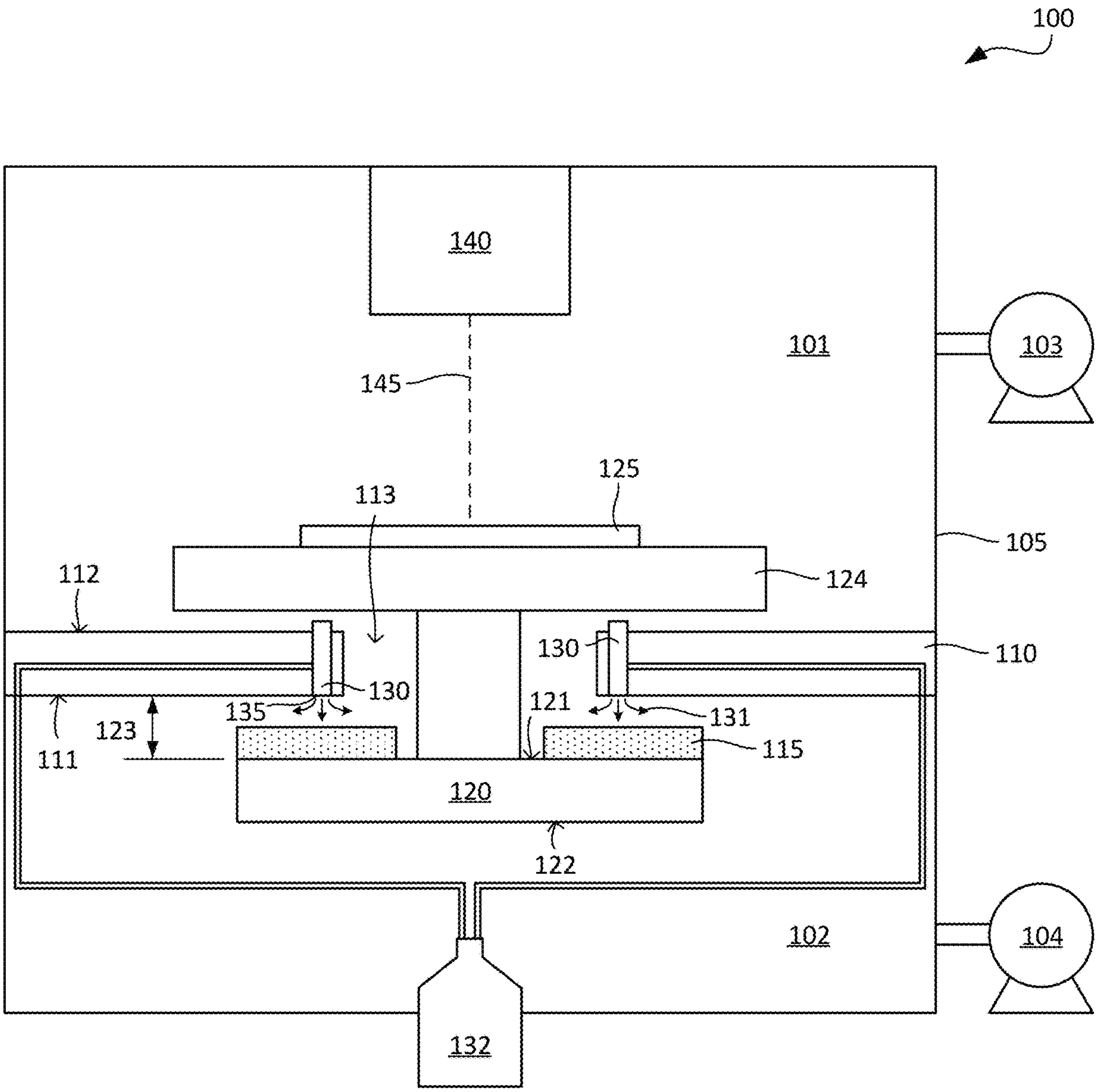
FIG. 5A illustrates an alternative arrangement of the apparatus of FIG. 1.
Figure 5B:
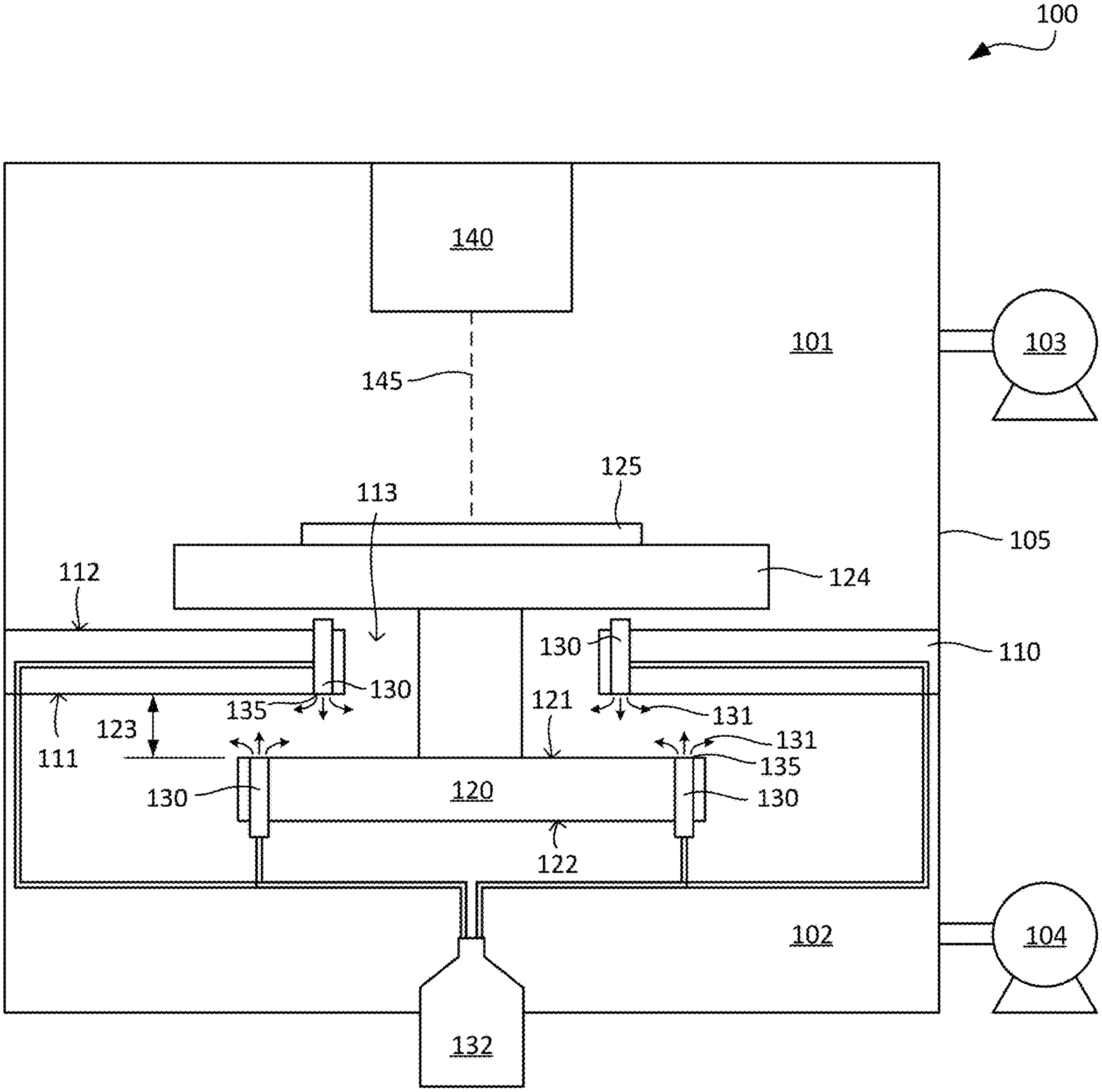
FIG. 5B illustrates another alternative arrangement of the apparatus of FIG. 1.

The gas injector 130 may inject the buffer gas 131 from at least one hole 135 in at least one of the first component 110 and the second component 120. For example, the at least one hole 135 may be disposed on the first side 111 of the first component 110 and/or the first side 121 of the second component 120. In the apparatus 100 illustrated in FIG. 1, the at least one hole 135 is shown on the first side 121 of the second component 120, but it should be understood that the at least one hole 135 may be alternatively disposed on the first side 111 of the first component 110 (as shown in FIG. 5A), or disposed on both the first side 121 of the second component 120 and the first side 111 of the first component 110 (as shown in FIG. 5B). When gas injectors 130 are disposed on both sides of the gap 123, separate buffer gas sources 132 may be provided to supply the buffer gas 131 from each side, or a single buffer gas source 132 may be provided (as shown in FIG. 5B) to supply the buffer gas 131 to both sides. The gas injector 130 may comprise a singular gas injector configured to inject the buffer gas 131 from one or more holes 135 or a plurality of gas injectors each configured to inject the buffer gas 131 from one or more holes 135. For example, as shown in FIG. 3, a plurality of gas injectors 130 may be arranged in a ring shape around the edges of the first side 121 of the second component 120. Alternatively, a ring-shaped gas injector may be provided having holes arranged in a similar manner. While the plurality of gas injectors 130 are illustrated in a circular arrangement, other arrangements are possible, depending on the shape of the first component 110 and/or the second component 120. For example, the plurality of gas injectors 130 may be arranged in a polygonal shape for a square or rectangular first component 110 (or aperture 113) or second component 120.

Figure 4A:
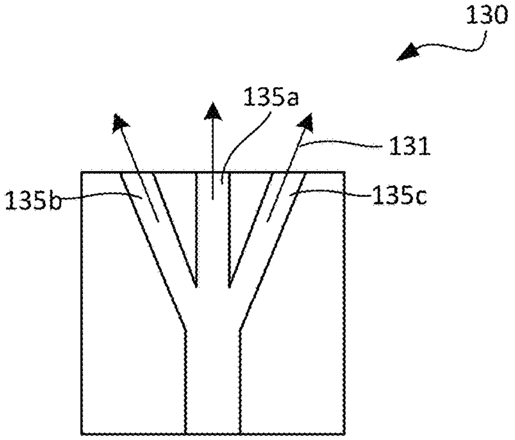
FIG. 4A is a sectional side view of a gas injector according to an embodiment of the present disclosure.
Figure 4B:
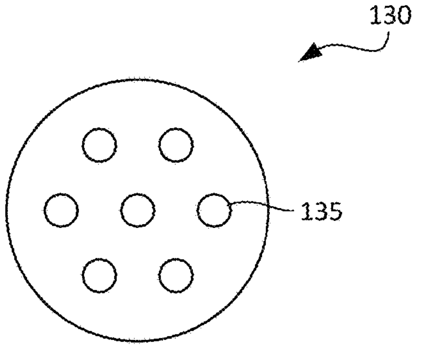
FIG. 4B is a top view of a gas injector according to an embodiment of the present disclosure.

According to an embodiment of the present disclosure, each gas injector 130 may inject buffer gas 131 from a plurality of holes 135. For example, as shown in FIG. 4B, the gas injector 130 may inject buffer gas 131 from a plurality of holes 135 in an array. The plurality of holes 135 may be configured to direct the buffer gas 131 towards the first vacuum zone 101 and/or the second vacuum zone 102. For example, as shown in FIG. 4A, the plurality of holes may comprise a straight hole 135*a*, an inward hole 135*b*, and/or an outward hole 135*c*. The straight hole 135*a* may be configured to direct the buffer gas 131 perpendicular from the first side 111 of the first component 110 and/or the first side 121 of the second component 120. The buffer gas 131 may therefore spread to both the first vacuum zone 101 and the second vacuum zone 102. The inward hole 135*b* may be configured to direct the buffer gas 131 at an acute angle from the first side 111 of the first component 110 and/or the first side 121 of the second component 120. The buffer gas 131 may therefore spread inward toward the first vacuum zone 101. The outward hole 135*c* may be configured to direct the buffer gas 131 at an obtuse angle from the first side 111 of the first component 110 and/or the first side 121 of the second component 120. The buffer gas 131 may therefore spread outward toward the second vacuum zone 102. It should be understood that the at least one hole 135 may comprise all or some of these three types of holes, or may only comprise one type of hole.

By injecting the buffer gas 131 into the gap 123, a gas curtain may be created, which may provide a dynamic seal between the first vacuum zone 101 and the second vacuum zone 102. The dynamic seal may prevent contaminants from transferring between the first vacuum zone 101 and the second vacuum zone 102 when the first component 110 and the second component 120 are stationary, and during movement of the second component 120 relative to the first component 110.

The apparatus 100 may further comprise a seal 115 disposed on the first component 110 or the second component 120 in the gap 123. For example, as shown in FIG. 1, the seal 115 may be disposed on the first side 111 of the first component 110 opposite to the gas injectors 130. Alternatively, the seal 115 may be disposed on the first side 121 of the second component 120 when the gas injectors 130 are provided on the first side 111 of the first component 110 (as shown in FIG. 5A). It should be understood that when gas injectors 130 are provided on both sides of the gap 123, the holes 135 may extend through or around a seal 115 on the first side 111 of the first component 110 and/or a seal 115 on the first side 121 of the second component 120. The seal 115 may also be integrally formed as part of the first component 110 or the second component 120. The seal 115 may be made from the same material as the first component 110 or the second component 120, or may be made of a different material. As shown in FIG. 2, the seal 115 may be a ring shape and may surround the aperture 113 of the first component 110. A thickness of the seal 115 may be less than a distance of the gap 123. In other words, the seal 115 may not completely fill the distance between the first component 110 and the second component 120, so that the effective distance of the gap 123 between the first component 110 and the second component 120 can be narrowed. It should be understood that the buffer gas 131 may be provided in the gap 123 with the seal 115, so as to further prevent contaminants from transferring between the first vacuum zone 101 and the second vacuum zone 102. Narrowing of the gap 123 using the seal 115 may further reduce the amount of contaminants that can transfer between the first vacuum zone 101 and the second vacuum zone 102, and may improve the effectiveness of the dynamic seal provided by the buffer gas 131. The width of the seal 115 may depend on the range of travel of the second component 120. In other words, the seal 115 may be wide enough so as to be across the gap 123 from the buffer gas injector 130 when the second component 120 moves relative to the first component 110.

The apparatus 100 may further comprise an inspection tool 140. The inspection tool 140 may be disposed in the first vacuum zone 101. The inspection tool 140 may be configured to inspect the sample 125 disposed on the second component 120. The inspection tool 140 may have an optical axis 145 directed towards the sample 125, so as to inspect a portion of the sample 125 that is intersected by the optical axis 145. The inspection tool 140 may direct extreme ultraviolet (EUV) light, deep ultraviolet (DUV) light, broadband light, 266 nm or 193 nm laser, an x-ray beam, electron beam, or other types of beams along the optical axis 145 to inspect the sample 125. By moving the second component 120 relative to the first component 110, the sample 125 may also move, such that a different portion of the sample 125 may be intersected by the optical axis 145 for inspection.

With the apparatus 100, a dynamic seal may be provided between the first component 110 and the second component 120 that can be maintained while the second component 120 moves relative to the first component 110. This dynamic seal may prevent contaminants from transferring between the first vacuum zone 101 and the second vacuum zone 102 of the vacuum chamber 105, so as to prevent cross-contamination and more easily maintain an ultra-clean vacuum system.

Figure 6:
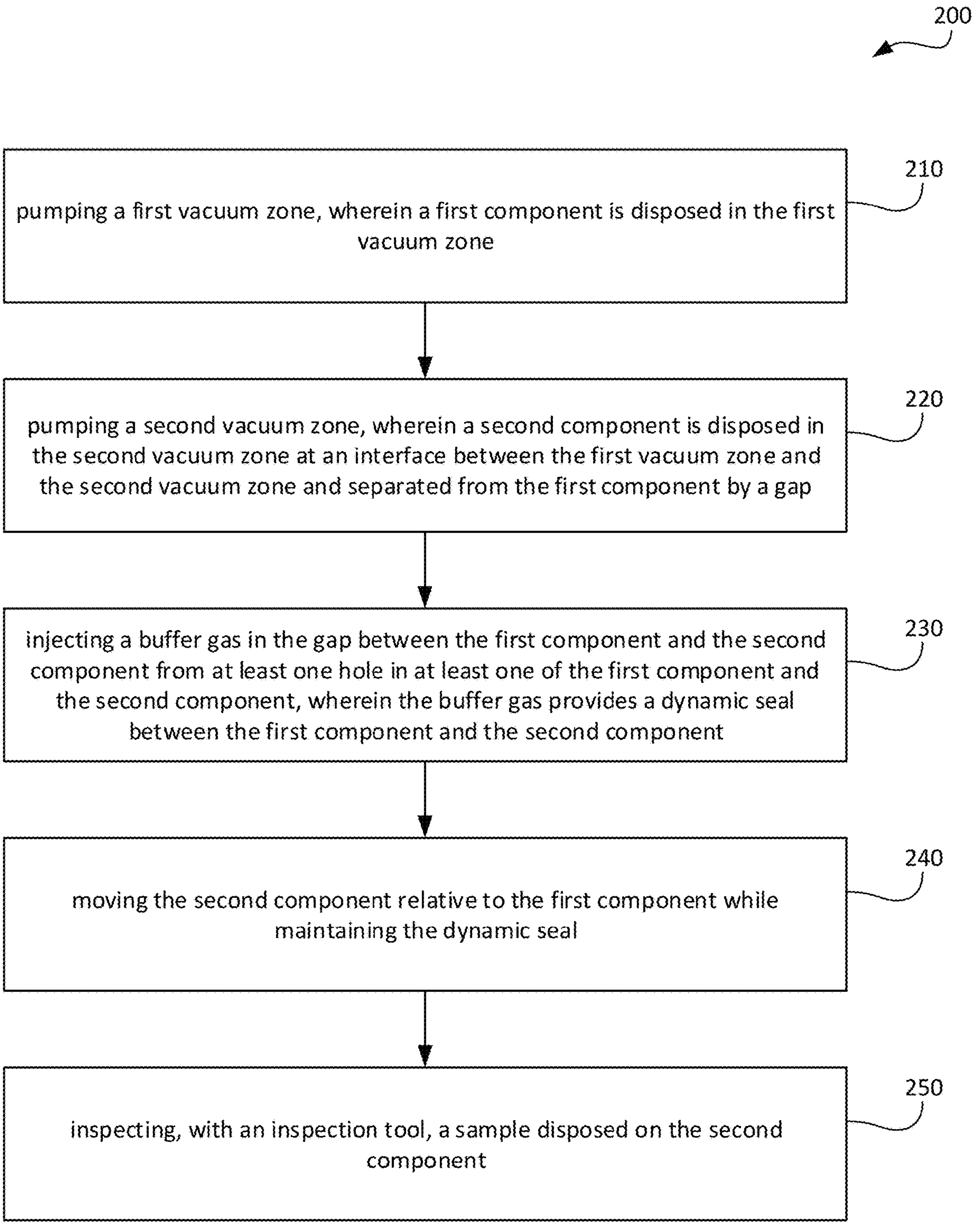
FIG. 6 is a flow chart of a method according to an embodiment of the present disclosure.

An embodiment of the present disclosure provides a method 200. As shown in FIG. 6, the method 200 may comprise the following steps.

At step 210, a first vacuum zone is pumped. The first vacuum zone may be a portion of a larger vacuum chamber. The first vacuum zone may be pumped by a first vacuum pump to a low or vacuum pressure. The vacuum pressure may be less than $10^{-7}$ mbar. For example, the vacuum pressure may be ultra-high vacuum (UHV) levels (e.g., between $10^{-7}$ and $10^{-12}$ mbar). A first component may be disposed in the first vacuum zone.

At step 220, a second vacuum zone is pumped. The second vacuum zone may be another portion of the larger vacuum chamber, separate from the first vacuum zone. The second vacuum zone may be pumped by a second vacuum pump to a low or vacuum pressure. The pressure in the second vacuum zone may be the same or different from the first vacuum zone. A second component may be disposed in the second vacuum zone at an interface between the first vacuum zone and the second vacuum zone, such that the first component and the second component are separated by a gap.

While steps 210 and 220 are described separately, it should be understood that steps 210 and 220 may be performed simultaneously or in overlapping succession. For example, the first vacuum pump and the second vacuum pump may be started at the same time or one after the other, so that each chamber reaches the desired pressure. By operating both vacuum pumps at the same time, lower pressures can be achieved, as gas would not leak into the pumped chamber from the other chamber at atmospheric pressure.

At step 230, a buffer gas is injected in the gap between the first component and the second component from at least one hole in at least one of the first component and the second component. The buffer gas may provide a dynamic seal between the first component and the second component. The buffer gas may be provided by a buffer gas source. The buffer gas may be clean dry air (CDA), nitrogen gas, or an inert gas (e.g., argon). The buffer gas source may be configured to control the flow rate of the buffer gas. When the buffer gas is injected into the gap, the buffer gas may travel to the first vacuum zone and/or the second vacuum zone. Thus, the buffer gas may be removed from the vacuum chamber by the first vacuum pump and/or the second vacuum pump. The buffer gas source may be configured to control the flow rate of the buffer gas so as to minimize the pumping requirements of the first vacuum pump and the second vacuum pump. The buffer gas may be injected by a singular gas injector or a plurality of gas injectors. Each buffer gas injector may be configured to inject the buffer gas from one or more holes. For example, the buffer gas may be injected from a plurality of holes in an array. The plurality of holes may be configured to direct the buffer gas towards the first vacuum zone and/or the second vacuum zone. For example, the plurality of holes may comprise a straight hole, an inward hole, and an outward hole. The straight hole may be configured to direct the buffer gas perpendicular from the first component and/or the second component, so that the buffer gas is spread to both the first vacuum zone and the second vacuum zone. The inward hole may be configured to direct the buffer gas at an acute angle from the first component and/or the second component, so that the buffer gas is spread inward toward the first vacuum zone. The outward hole may be configured to direct the buffer gas at an obtuse angle from the first component and/or the second component, so that the buffer gas is spread outward toward the second vacuum zone. It should be understood that the at least one hole may comprise all or some of these three types of holes, or may only comprise one type of hole.

At step 240, the second component is moved relative to the first component while maintaining the dynamic seal. The second component may be movable relative to the first component. For example, the second component may be movable parallel to the first component in at least one direction. The second component may be movable parallel to the first component in two orthogonal directions. When the second component moves relative to the first component, the first component and the second component may remain separated by the gap. By injecting the buffer gas into the gap, a gas curtain may be created, which may provide a dynamic seal between the first component and the second component and their respective vacuum zones. The dynamic seal may prevent contaminants from transferring between the first vacuum zone and the second vacuum zone when the first component and the second component are stationary, and during movement of the second component relative to the first component.

At step 250, a sample disposed on the second component is inspected using an inspection tool. The inspection tool may be disposed in the first vacuum zone. The inspection tool may be configured to inspect the sample disposed on the second component. The inspection tool may have an optical axis directed towards the sample, so as to inspect a portion of the sample that is intersected by the optical axis. The inspection tool may direct extreme ultraviolet (EUV) light, deep ultraviolet (DUV) light, broadband light, 266 nm or 193 nm laser, an x-ray beam, electron beam, or other types of light/beams along the optical axis to inspect the sample. By moving the second component relative to the first component, the sample may also move, such that a different portion of the sample may be intersected by the optical axis for inspection.

With the method, a dynamic seal may be provided between the first component and the second component that can be maintained while the second component moves relative to the first component. This dynamic seal may prevent contaminants from transferring between the first vacuum zone and the second vacuum zone of the vacuum chamber, so as to prevent cross-contamination and more easily maintain an ultra-clean vacuum system.

Figure 7:
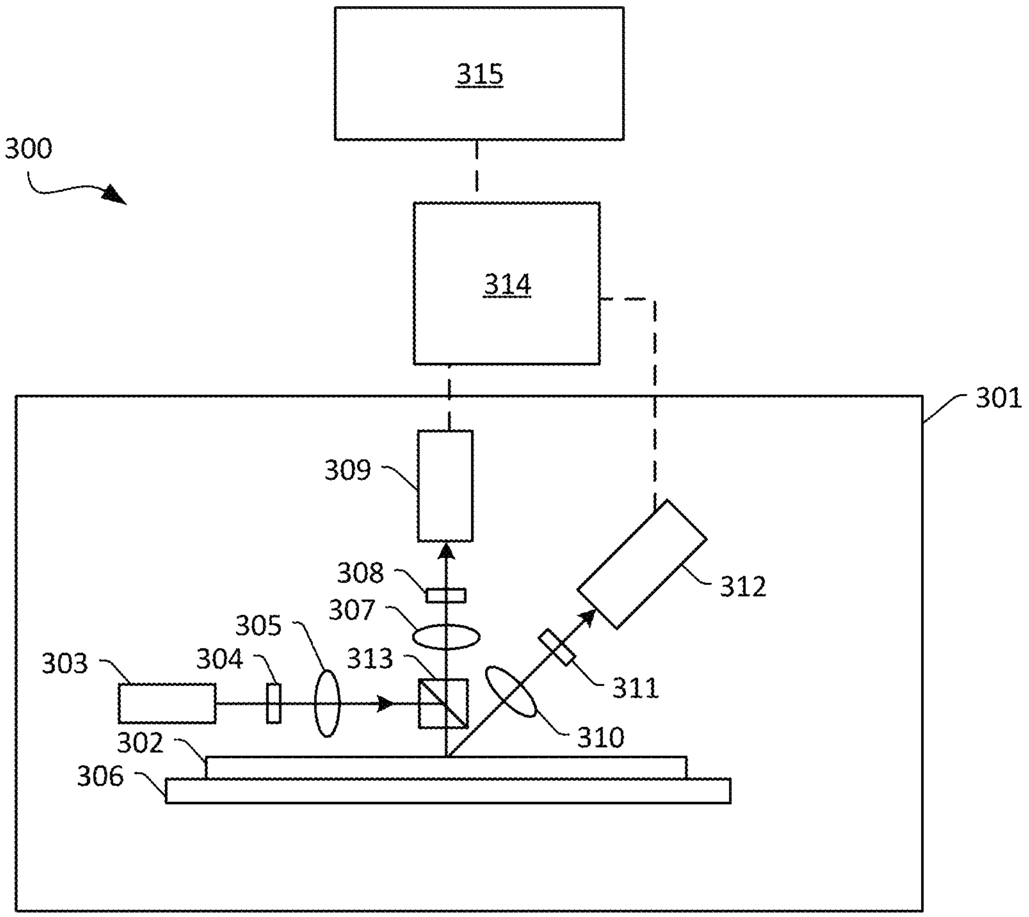
FIG. 7 illustrates a system according to an embodiment of the present disclosure.

FIG. 7 is a block diagram of an embodiment of a system 300 according to another embodiment of the present disclosure. The system 300 includes optical based subsystem 301. In general, the optical based subsystem 301 is configured for generating optical based output for a specimen 302 by directing light to (or scanning light over) and detecting light from the specimen 302. In one embodiment, the specimen 302 includes a wafer. The wafer may include any wafer known in the art. In another embodiment, the specimen 302 includes a reticle. The reticle may include any reticle known in the art.

In the embodiment of the system 300 shown in FIG. 7, optical based subsystem 301 includes an illumination subsystem configured to direct light to specimen 302. The illumination subsystem includes at least one light source. For example, as shown in FIG. 7, the illumination subsystem includes light source 303. In one embodiment, the illumination subsystem is configured to direct the light to the specimen 302 at one or more angles of incidence, which may include one or more oblique angles and/or one or more normal angles. For example, as shown in FIG. 7, light from light source 303 is directed through optical element 304 and then lens 305 to specimen 302 at an oblique angle of incidence. The oblique angle of incidence may include any suitable oblique angle of incidence, which may vary depending on, for instance, characteristics of the specimen 302.

The optical based subsystem 301 may be configured to direct the light to the specimen 302 at different angles of incidence at different times. For example, the optical based subsystem 301 may be configured to alter one or more characteristics of one or more elements of the illumination subsystem such that the light can be directed to the specimen 302 at an angle of incidence that is different than that shown in FIG. 7. In one such example, the optical based subsystem 301 may be configured to move light source 303, optical element 304, and lens 305 such that the light is directed to the specimen 302 at a different oblique angle of incidence or a normal (or near normal) angle of incidence.

In some instances, the optical based subsystem 301 may be configured to direct light to the specimen 302 at more than one angle of incidence at the same time. For example, the illumination subsystem may include more than one illumination channel, one of the illumination channels may include light source 303, optical element 304, and lens 305 as shown in FIG. 7 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 302 at different angles of incidence may be different such that light resulting from illumination of the specimen 302 at the different angles of incidence can be discriminated from each other at the detector(s).

In another instance, the illumination subsystem may include only one light source (e.g., light source 303 shown in FIG. 7) and light from the light source may be separated into different optical paths (e.g., based on wavelength, polarization, etc.) by one or more optical elements (not shown) of the illumination subsystem. Light in each of the different optical paths may then be directed to the specimen 302. Multiple illumination channels may be configured to direct light to the specimen 302 at the same time or at different times (e.g., when different illumination channels are used to sequentially illuminate the specimen). In another instance, the same illumination channel may be configured to direct light to the specimen 302 with different characteristics at different times. For example, in some instances, optical element 304 may be configured as a spectral filter and the properties of the spectral filter can be changed in a variety of different ways (e.g., by swapping out the spectral filter) such that different wavelengths of light can be directed to the specimen 302 at different times. The illumination subsystem may have any other suitable configuration known in the art for directing the light having different or the same characteristics to the specimen 302 at different or the same angles of incidence sequentially or simultaneously.

In one embodiment, light source 303 may include a broadband plasma (BBP) source. In this manner, the light generated by the light source 303 and directed to the specimen 302 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 303 may also include a polychromatic light source that generates light at multiple discrete wavelengths or wavebands.

Light from optical element 304 may be focused onto specimen 302 by lens 305. Although lens 305 is shown in FIG. 7 as a single refractive optical element, it is to be understood that, in practice, lens 305 may include a number of refractive and/or reflective optical elements that in combination focus the light from the optical element to the specimen. The illumination subsystem shown in FIG. 7 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 313), aperture(s), and the like, which may include any such suitable optical elements known in the art. In addition, the optical based subsystem 301 may be configured to alter one or more of the elements of the illumination subsystem based on the type of illumination to be used for generating the optical based output.

The optical based subsystem 301 may also include a scanning subsystem configured to cause the light to be scanned over the specimen 302. For example, the optical based subsystem 301 may include stage 306 on which specimen 302 is disposed during optical based output generation. The scanning subsystem may include any suitable mechanical and/or robotic assembly (that includes stage 306) that can be configured to move the specimen 302 such that the light can be scanned over the specimen 302. In addition, or alternatively, the optical based subsystem 301 may be configured such that one or more optical elements of the optical based subsystem 301 perform some scanning of the light over the specimen 302. The light may be scanned over the specimen 302 in any suitable fashion such as in a serpentine-like path or in a spiral path. The stage 306 may correspond to a portion of the second component 120 of the apparatus 100 described above.

The optical based subsystem 301 further includes one or more detection channels. At least one of the one or more detection channels includes a detector configured to detect light from the specimen 302 due to illumination of the specimen 302 by the subsystem and to generate output responsive to the detected light. For example, the optical based subsystem 301 shown in FIG. 7 includes two detection channels, one formed by collector 307, element 308, and detector 309 and another formed by collector 310, element 311, and detector 312. As shown in FIG. 7, the two detection channels are configured to collect and detect light at different angles of collection. In some instances, both detection channels are configured to detect scattered light, and the detection channels are configured to detect light that is scattered at different angles from the specimen 302. However, one or more of the detection channels may be configured to detect another type of light from the specimen 302 (e.g., reflected light).

As further shown in FIG. 7, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 310, element 311, and detector 312 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 7 shows an embodiment of the optical based subsystem 301 that includes two detection channels, the optical based subsystem 301 may include a different number of detection channels (e.g., only one detection channel or two or more detection channels). In one such instance, the detection channel formed by collector 310, element 311, and detector 312 may form one side channel as described above, and the optical based subsystem 301 may include an additional detection channel (not shown) formed as another side channel that is positioned on the opposite side of the plane of incidence. Therefore, the optical based subsystem 301 may include the detection channel that includes collector 307, element 308, and detector 309 and that is centered in the plane of incidence and configured to collect and detect light at scattering angle(s) that are at or close to normal to the specimen 302 surface. This detection channel may therefore be commonly referred to as a "top" channel, and the optical based subsystem 301 may also include two or more side channels configured as described above. As such, the optical based subsystem 301 may include at least three channels (i.e., one top channel and two side channels), and each of the at least three channels has its own collector, each of which is configured to collect light at different scattering angles than each of the other collectors.

As described further above, each of the detection channels included in the optical based subsystem 301 may be configured to detect scattered light. Therefore, the optical based subsystem 301 shown in FIG. 7 may be configured for dark field (DF) output generation for specimens 302. However, the optical based subsystem 301 may also or alternatively include detection channel(s) that are configured for bright field (BF) output generation for specimens 302. In other words, the optical based subsystem 301 may include at least one detection channel that is configured to detect light specularly reflected from the specimen 302. Therefore, the optical based subsystems 301 described herein may be configured for only DF, only BF, or both DF and BF imaging. Although each of the collectors are shown in FIG. 7 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 314 may be configured to generate images of the specimen 302 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 7 is provided herein to generally illustrate a configuration of an optical based subsystem 301 that may be included in the system embodiments described herein or that may generate optical based output that is used by the system embodiments described herein. The optical based subsystem 301 configuration described herein may be altered to optimize the performance of the optical based subsystem 301 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 314 may be coupled to the components of the system 300 in any suitable manner (e.g., via one or more transmission media, which may include wired and/or wireless transmission media) such that the processor 314 can receive output. The processor 314 may be configured to perform a number of functions using the output. The system 300 can receive instructions or other information from the processor 314. The processor 314 and/or the electronic data storage unit 315 optionally may be in electronic communication with a wafer inspection tool, a wafer metrology tool, or a wafer review tool (not illustrated) to receive additional information or send instructions. For example, the processor 314 and/or the electronic data storage unit 315 can be in electronic communication with a scanning electron microscope.

The processor 314, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 314 and electronic data storage unit 315 may be disposed in or otherwise part of the system 300 or another device. In an example, the processor 314 and electronic data storage unit 315 may be part of a standalone control unit or in a centralized quality control unit. Multiple processors 314 or electronic data storage units 315 may be used.

The processor 314 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 314 to implement various methods and functions may be stored in readable storage media, such as a memory in the electronic data storage unit 315 or other memory.

If the system 300 includes more than one processor 314, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 314 may be configured to perform a number of functions using the output of the system 300 or other output. For instance, the processor 314 may be configured to send the output to an electronic data storage unit 315 or another storage medium. The processor 314 may be configured according to any of the embodiments described herein. The processor 314 also may be configured to perform other functions or additional steps using the output of the system 300 or using images or data from other sources.

The processor 314 may be configured to control one or more functions of the apparatus 100 and/or steps of method 200 described above. For example, the processor 314 may be configured to control the second component 120 of the apparatus 100 to move relative to the first component 110. The processor 314 may be configured to control the buffer gas injector 130 to inject a buffer gas 131 in the gap 123 between the first component 110 and the second component 120 of the apparatus 100. The processor 314 may be configured to control the first vacuum pump 103 and/or the second vacuum pump 104 to pump the first vacuum zone 101 and/or the second vacuum zone 102 to low or vacuum pressures.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 314 or, alternatively, multiple processors 314. Moreover, different subsystems of the system 300 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:

a vacuum chamber comprising a first vacuum zone and a second vacuum zone;

a first component disposed in the first vacuum zone at an interface with the second vacuum zone, wherein the first component defines an aperture with a central axis, wherein the first component includes a plurality of first component gas injectors in the first component a first distance from the central axis, and wherein each of the first component gas injectors defines a hole;

a second component disposed in the second vacuum zone at the interface and separated from the first component by a gap, wherein the second component is movable relative to the first component along the central axis, wherein the second component includes a plurality of second component gas injectors in the second component a second distance from the central axis, wherein each of the second component gas injectors defines a hole, and wherein the second distance is different from the first distance; and a gas injector configured to inject a buffer gas in the gap between the first component and the second component from the holes in the first component gas injector and the holes in the second component gas injector;

wherein the buffer gas provides a dynamic seal between the first vacuum zone and the second vacuum zone during movement of the second component relative to the first component.

2. The apparatus of claim 1, wherein the first vacuum zone and the second vacuum zone are pumped by separate vacuum pumps.

3. The apparatus of claim 1, wherein at least one of the first vacuum zone and the second vacuum zone are at an ultra-high vacuum pressure.

4. The apparatus of claim 1, wherein at least one of the first component gas injectors and at least one of the second component gas injectors each comprises a plurality of the holes.

5. The apparatus of claim 4, wherein the plurality of holes are configured to direct the buffer gas towards the first vacuum zone and the second vacuum zone.

6. The apparatus of claim 1, further comprising a seal disposed on the first component in the gap, wherein a thickness of the seal is less than a distance of the gap.

7. The apparatus of claim 1, wherein the second component is movable parallel to the first component along the interface.

8. The apparatus of claim 1, wherein the first component comprises an aperture, and the second component covers the aperture.

9. The apparatus of claim 1, further comprising an inspection tool configured to inspect a sample disposed on the second component.

10. The apparatus of claim 1, wherein the first component is a shielding plate and the second component is a stage.

11. A method comprising:

pumping a first vacuum zone, wherein a first component is disposed in the first vacuum zone, wherein the first component defines an aperture with a central axis, wherein the first component includes a plurality of first component gas injectors in the first component a first distance from the central axis, and wherein each of the first component gas injectors defines a hole;

pumping a second vacuum zone, wherein a second component is disposed in the second vacuum zone at an interface between the first vacuum zone and the second vacuum zone and separated from the first component by a gap, wherein the second component includes a plurality of second component gas injectors in the second component a second distance from the central axis, wherein each of the second component gas injectors defines a hole, and wherein the second distance is different from the first distance;

injecting a buffer gas in the gap between the first component and the second component from the holes in the first component gas injector and the holes in the second component gas injector, wherein the buffer gas provides a dynamic seal between the first component and the second component; and moving the second component along the central axis relative to the first component while maintaining the dynamic seal.

12. The method of claim 11, wherein the first vacuum zone and the second vacuum zone are pumped by separate vacuum pumps.

13. The method of claim 11, wherein at least one of the first vacuum zone and the second vacuum zone are at an ultra-high vacuum pressure.

14. The method of claim 11, wherein at least one of the first component gas injectors and at least one of the second component gas injectors comprise a plurality of the holes, and injecting the buffer gas in the gap between the first component and the second component from the holes in at least one of the first component gas injectors and the second component gas injectors comprises:

injecting the buffer gas in the gap from the plurality of holes in the first component gas injector and the second component gas injector.

15. The method of claim 14, wherein the buffer gas is directed towards the first vacuum zone and the second vacuum zone by the plurality of holes.

16. The method of claim 11, wherein a seal is disposed on the first component in the gap, and a thickness of the seal is less than a distance of the gap.

17. The method of claim 11, wherein moving the second component relative to the first component comprises:

moving the second component parallel to the first component along the interface.

18. The method of claim 11, wherein the first component comprises an aperture, and the second component covers the aperture.

19. The method of claim 11, further comprising:

inspecting, using an inspection tool, a sample disposed on the second component.

20. The method of claim 11, wherein the first component is a shielding plate and the second component is a stage.

* * * * *